(12) United States Patent
Chiba et al.

(10) Patent No.: US 6,777,820 B2
(45) Date of Patent: Aug. 17, 2004

(54) SEMICONDUCTOR WAFER

(75) Inventors: Teiichirou Chiba, Hiratsuka (JP); Etsurou Satou, Hiratsuka (JP); Jun Tajika, Hiratsuka (JP)

(73) Assignee: Komatsu Electronic Metals Co., Ltd., Tokyo (JP)

( * ) Notice: Subject to any disclaimer, the term of this patent is extended or adjusted under 35 U.S.C. 154(b) by 0 days.

(21) Appl. No.: 09/492,761

(22) Filed: Jan. 27, 2000

(65) Prior Publication Data
US 2003/0015806 A1 Jan. 23, 2003

(30) Foreign Application Priority Data

Jan. 28, 1999  (JP) .......................................... 11-019737

(51) Int. Cl.⁷ .......................................... H01L 23/544
(52) U.S. Cl. ...................... 257/797; 257/618; 257/620; 257/622; 428/64.1; 428/66.7
(58) Field of Search .................. 257/797, 618–628; 428/64.1, 66.7

(56) References Cited

U.S. PATENT DOCUMENTS

| | | | | |
|---|---|---|---|---|
| 4,327,292 A | * | 4/1982 | Wang et al. | 250/491.1 |
| 4,418,467 A | * | 12/1983 | Iwai | 148/33 |
| 4,547,446 A | * | 10/1985 | Tam | 430/22 |
| 4,701,050 A | * | 10/1987 | Oshida et al. | 356/139.07 |
| 5,028,200 A | * | 7/1991 | Shimane | 414/757 |
| 5,876,819 A | * | 3/1999 | Kimura et al. | 428/64.1 |
| 5,907,144 A | * | 5/1999 | Poon et al. | 235/462.08 |
| 6,004,405 A | * | 12/1999 | Oishi et al. | 148/33.2 |
| 6,120,607 A | * | 9/2000 | Taravade | 118/720 |
| 6,268,641 B1 | * | 7/2001 | Yano et al. | 257/620 |
| 6,277,658 B1 | * | 8/2001 | Jeng et al. | 438/14 |

FOREIGN PATENT DOCUMENTS

| | | | |
|---|---|---|---|
| JP | 57095158 A | * | 6/1982 |
| JP | 59-23512 | | 2/1984 |
| JP | 59119820 | | 7/1984 |
| JP | 2175154 | | 7/1990 |
| JP | 10256105 | | 9/1998 |
| JP | 11156563 | | 6/1999 |
| JP | 11162800 | | 6/1999 |
| JP | 11214299 | | 8/1999 |
| JP | 11260675 | | 9/1999 |
| JP | 11329915 A | * | 11/1999 |
| JP | 200042763 | | 2/2000 |

* cited by examiner

*Primary Examiner*—Bradley Baumeister
*Assistant Examiner*—Chris C Chu
(74) *Attorney, Agent, or Firm*—Varndell & Varndell, PLLC

(57) ABSTRACT

To provide a semiconductor wafer having dot marks produced by irradiating laser beam capable of selecting a marking region capable of reading and writing marks in a state in which the marks hardly vanish and the semiconductor wafer is contained in a wafer cassette, inscribing information of an identification number or electric properties in the region and grasping past history by a unit of the wafer in processing steps or semiconductor fabrication steps thereafter, a very small dot mark is formed by irradiating laser having a diameter of 1 through 13 μm on an inner wall face of a notch (1) formed on an outer peripheral face of a semiconductor wafer (W), particularly on an inclined face of its peripheral edge.

18 Claims, 7 Drawing Sheets

EXPLANATORY VIEW SHOWING A SEMICONDUCTOR WAFER ACCORDING TO THE INVENTION IN WHICH MARKING IS CARRIED OUT ON A PORTION OF A NOTCH PORTION

EXPLANATORY VIEW SHOWING A SEMICONDUCTOR
WAFER ACCORDING TO THE INVENTION IN WHICH MARKING
IS CARRIED OUT ON A PORTION OF A NOTCH PORTION

PLANE VIEW SHOWING A RELATIONSHIP BETWEEN A
SHAPE OF A NOTCH AND A PIN INSERTED INTO THE NOTCH

SECTIONAL VIEWS SHOWING EXAMPLES OF SECTIONAL SHAPES
OF A PERIPHERAL EDGE PORTION OF A SEMICONDUCTOR WAFER

SECTIONAL VIEW SHOWING A SECTIONAL FACE OF A PERIPHERAL EDGE PORTION ACCORDING TO AN EMBODIMENT OF THE INVENTION

PLANE VIEW SHOWING A DIFFERENCE IN A DIMENSION OF A WALL FACE IN A MARKING REGION OF AN INNER WALL FACE OF A NOTCH

EXPLANATORY VIEW SCHEMATICALLY SHOWING A VERY SMALL DOT MARKING APPARATUS APPLIED TO THE INVENTION AND A PROCEDURE OF CONVERTING AN ENERGY DENSITY DISTRIBUTION (BEAM PROFILE) OF LASER BEAM

EXPLANATORY VIEW SCHEMATICALLY SHOWING DOT MARKS FORMED IN ACCORDANCE WITH A DISPLAY PATTERN OF A LIQUID CRYSTAL MASK IN A MARKING APPARATUS AND A PROCEDURE OF CONVERTING AN ENERGY DISTRIBUTION OF LASER BEAM

PLANE VIEW SHOWING ALPHANUMERIC CHARACTERS BY DOT MARKS
INSCRIBED ON AN INCLINED FACE OF A NOTCH OF A SEMICONDUCTOR WAFEB

SEMICONDUCTOR WAFER

BACKGROUND OF THE INVENTION

1. Field of the Invention

The present invention relates to a semiconductor wafer formed with dot marks used in fabrication history or product control in semiconductor fabrication steps, further particularly to a semiconductor wafer having dot marks which are formed at a region least influential on reading accuracy at and after semiconductor wafer and device fabrication steps and effecting no influence on electric properties of the wafer per se and produced by laser irradiation ensuring a desired amount of information.

2. Description of the Related Art

Conventionally, in makers of wafers and devices of semiconductors, with an object of process control or production control, a surface of a wafer is marked by bar codes, characters or numerical characters as a clue for finding processing conditions, fabrication history or electric properties up to the occasion. A laser marker is frequently used as an apparatus of making these. According to marking operation by a laser marker, laser beam emitted from a laser oscillator is condensed via an optical system and at the same time, a predetermined region on a surface of a wafer is scanned with laser beam by a beam scanning apparatus to thereby locally melt the surface of the wafer to form a recessed and projected surface and inscribe desired information.

Generally, the marking region is a portion of a wafer at a vicinity of an orientation flat face or a specific wafer surface region in the case of a wafer maker and a portion of a rear face or a mounting face of the substrate constituting a chip in the case of a device maker. However, in carrying out laser marking at these marking regions, regardless of a wafer or a chip substrate, a dead space for marking is needed and the yield is deteriorated. Further, since the mark is formed by melting a portion of the wafer surface, there is a concern of producing particles in melting thereof and by forming irregularities at the surrounding of the mark, there is pointed out a drawback in which a smooth face is deteriorated when a fine pattern is formed at high accuracy.

Hence, conventionally, in order to avoid such a drawback, there have been trials of executing laser marking on an outer peripheral face (side face) of a semiconductor wafer as disclosed in, for example, Japanese Patent Laid-Open No. 23512/1984 and Japanese Patent Laid-Open No. 175154/1990. That is, according to a laser marking method disclosed in Japanese Patent Laid-Open No. 23512/1984, laser beam emitted from a laser oscillator is reflected by two sheets of mirrors orthogonal to each other and deflecting an angle of deviation in accordance with marking characters and irradiated to an outer peripheral side face of a wafer via a condensing lens to thereby continuously inscribe characters. Meanwhile, according to a laser marking method disclosed in Japanese Patent Laid-Open No. 175154/1990, after vacuuming to suck a rear face center of a semiconductor wafer by a vacuum chuck, an original point is determined by an orientation flat detecting mechanism, while rotating a pulse motor by a predetermined angle, a shutter is opened and closed in cooperation with rotation and stop of the pulse motor and laser beam emitted from a laser oscillator is condensed on an outer peripheral side face of an intermittently rotating wafer to heat a spot thereof thereby forming dot marks.

Further, other than the above-described publications, for example, according to Japanese Patent Laid-Open No. 256105/1998, a total peripheral face of a semiconductor wafer in a circular disk shape is chamfered by mirror finish and the chamfered portion is inscribed with a laser mark for determining crystal orientation and a laser mark for specification, product number or wafer ID, etc.

Meanwhile, in carrying out process control in a silicon maker, particularly in order to efficiently carry out wafer production, it is preferable to attach a number to every wafer from the following reason.

It is generally difficult to summarizingly control a plurality of sheets of wafers in a state in which the wafers are contained in wafer cassettes in polishing steps or heat treatment steps of the wafer. At every processing, the plurality of sheets of wafers contained in the wafer cassettes are discharged from the cassettes and are contained again in the cassettes after the individual processings. Further, in the discharging operation, transferring among respective steps or in the containing operation to the cassettes, cracking or chipping is liable to be produced by mechanical interference between the wafers and peripheral members. When laser marking is carried out on the peripheral side face of a semiconductor wafer as disclosed in the above-described publications, the marks are lost by cracking or chipping.

Further, semiconductor wafers need to be classified to respective grades at each occasion according to modes of causing cracking or chipping or a result of inspecting electric properties etc. inspected at every processing step. And also in the classifying operation, wrong classification is liable to cause by mistake of an operator. Further, in the classifying operation, the specification significantly differs depending on users and complicated classification is needed.

Hence, when readable marking can be inscribed on the wafer surface even after having been processed in steps, easy mistake can be prevented from causing in the classifying operation. However, when laser marking is carried out on the wafer surface, as mentioned above, there poses a problem in which particles are produced thereby, the flatness of the wafer is obliged to sacrifice or the marked portion may constitute an onset of crystal strain. Hence, conventionally, wafers are not controlled individually but controlled in a unit of lot or controlled in a unit of wafer cassette.

On the other hand, according to a size of a dot mark formed on the wafer surface by normal laser marking, a limit of its diameter is 15 $\mu$m and the dot mark cannot be downsized to less than the limit. Therefore, in marking a peripheral side face of a wafer by the laser marking methods disclosed in the respective publications, mentioned above, when a desired amount of information is to be inscribed, most of the peripheral side face is needed. In order to find necessary information from the pieces of information, the necessary information needs to search by rotating the wafer. In the case of the semiconductor wafer disclosed in the above-described respective publications, in a state in which the semiconductor wafer is contained in a wafer cassette, desired laser marking cannot be inscribed and naturally, these marks cannot be read.

SUMMARY OF THE INVENTION

The invention has been carried out in order to resolve these problems and it is an object of the invention to provide a semiconductor wafer having laser marks in which specifically, at a time point as early as possible in steps of fabricating a semiconductor wafer, a writable and readable region is selected in an individual wafer in a state in which the regions are mostly difficult to lose and the wafers are contained in wafer cassettes and information such as an identification number or electric properties is written to the region to thereby enable to grasp past history by a unit of wafer at and after processing steps or semiconductor fabrication steps.

In order to achieve such an object, the inventors have carried out an investigation from various angles. First, the first angle resides in selecting a region of a semiconductor wafer in which the above-described problems are not posed even by laser marking of the semiconductor wafer and marks are difficult to lose even having been processed in various fabrication steps in fabrication steps of the wafer and fabrication steps of semiconductor. The second angle resides in whether the region is provided with an area enough for sufficiently writing a necessary amount of information. Further, the third angle resides in whether the marking region is a region capable of writing and reading marks to and from the wafer while the wafers are being contained in the wafer cassettes.

For example, according to fabrication steps of a semiconductor wafer, an ingot comprising a single crystal is sliced by a predetermined thickness, a peripheral face of the slice ingot is chamfered, successively, a surface and a rear face of the wafer is polished by lapping to a required thickness and subjected to chemical polishing, a film is formed on the rear face by heat treatment, thereafter, after having been processed by mirror finish, the wafer is subjected to intermediate inspection, is cleaned and is inspected again and epitaxial growth is carried out on the surface of an acceptable product.

It is known that in such numerous steps, a portion of the wafer particularly less influenced by polishing or chemical polishing is the peripheral side face of the wafer. Further, the wafer is transferred by being gripped by robots among the above-described respective steps. In transferring the wafer, the wafer is liable to interfere with peripheral parts and by the interference, cracking or chipping is frequently caused at a peripheral edge of the wafer including an orientation flat face. The inventors have found that a portion of the peripheral edge portion of the wafer which undergoes mechanical interference the least is an inner wall face region of a notch formed for positioning of crystal orientation or the like. Further, an advantage of the inner wall face of the notch resides in that the inner wall face hardly undergoes the influence not only by the mechanical interference but also by, for example, CMP (Chemical Mechanical Polishing). Because although a processing solution flows on the inner wall face of the notch, mechanical polishing is not carried out since no external force is operated on the inner wall face of the notch and the chemical polishing action is extremely minor.

In the case of the inner wall face of the notch, three is no influence by occurrence of particles by laser marking as described above, influence in forming patterns by irregular surfaces of laser marks and influence by crystal strain and a probability of losing marks by CMP is small. Meanwhile, a pin is inserted into the notch for determining the orientation of the wafer. Therefore, interference with the pin cannot be avoided even at the inner wall face of the notch. However, a mode of the notch is prescribed by SEMI standards and is provided with a mode shown by FIG. 2.

As can be understood from FIG. 2 drawing, a notch is opened to an outer side from a peripheral side face of a wafer having a diameter of 300 mm with an angle of 90 degree and a bottom portion thereof comprises a circular arc having a radius of curvature equal to or larger than 0.9 mm and a depth from the wafer peripheral side face is set to 1+0.25 mm. Meanwhile, the slenderest one of a diameter of a pin inserted into the notch is 3 mm and there are other pins having a diameter of 4 mm and a diameter of 5 mm. Therefore, even when the slenderest pin is inserted thereinto, the pin does not interfere with the circular arc face constituting the inner wall face of the bottom portion of the notch. The inventors have firstly paid attention to the circular arc face.

Next, the inventors have investigated on whether a region in the inner wall face of the notch which does not interfere with the pin can be increased. It has been known that according to the SEMI standards, although there is a prescription of chamfering a peripheral edge of a wafer, nothing is prescribed with regard to chamfering the inner wall face of the notch and accordingly, there is a degree of freedom in fabricating the inner wall face of the notch. It has been conceived that when a fabricated face is formed at the inner wall face of the notch for avoiding interference with the pin and the fabricated face is marked, marking can be carried out with a required amount of information. In order to prevent the marking face from interfering with the pin, the inference can be resolved by chamfering upper and lower edge line portions of the notch to thereby constitute inclined faces.

However, the inner wall face per se of the notch is a very small region and accordingly, in order to write a desired amount of information on the chamfered portion constituting a portion of the inner wall face, the mark per se needs to miniaturize. Then, simultaneously with the above-described investigation, an investigation has been carried out also on what size of a mark is necessary for marking a desired amount of information at the chamfered portion constituting a portion of the inner wall face of the notch. With regard to this point, the inventors have previously proposed a method of forming a very small dot mark having a size of 1 to 15 $\mu$m by using a laser marker on a surface of a semiconductor wafer as described in Japanese Patent Application No. 323080/1997 and Japanese Patent Application No. 323081/1997.

According to the method of forming a dot mark, an energy distribution of laser beam irradiated from a laser oscillator is made uniform by a beam homogenizer and a liquid crystal mask having a maximum length of 1 dot of 50 to 2000 $\mu$m is controlled to drive to thereby form a desired pattern. Meanwhile, beam profile converting means for converting an energy density distribution of beam is constituted by a dot matrix having a size the same as that of a dot matrix of the liquid crystal mask in correspondence therewith and the beam profile converting means is arranged on either of a front side and a rear side of the liquid crystal mask. The liquid crystal mask is irradiated with laser beam which has been made uniform by the beam homogenizer and laser beam having a unit of respective dot transmitting through the liquid crystal mask is made to transmit through the beam profile converting means in a desired shape of the energy density distribution, thereafter, the laser beam is made to pass through a lens unit and contracted such that a maximum sectional length of respective flux of laser beam becomes 1 to 10 $\mu$m and a very small dot mark is inscribed on the surface of a semiconductor wafer. At this occasion, a fabrication depth (height) of each dot mark can be controlled to fall in a range of 0.01 to 5 $\mu$m.

Meanwhile, a portion in the inner wall of the notch which is mostly suitable for writing is a linear portion and when calculated from the SEMI standards, a length of the linear portion is substantially 1 mm at maximum. When alphanumerical characters are written to the linear portion with a single font of 5×9 dots according to the SEMI standards, 12 characters are needed as a minimum character number to cover a minimum amount of information. At this occasion, the characters need to write at an interval of one dot.

Accordingly, the size of 1 dot in writing the characters in 1 mm of the linear portion is as follows.

$$1000(\mu m) \div \{6(\text{dots}) \times 12(\text{characters})\} = 13.89(\mu m)$$

That is, the size of 1 dot is 13.89 μm at maximum and the size needs to be smaller than that.

Conventionally, as described in Japanese Patent Laid-Open No. 119820/1984, the size is to a degree of 20 to 30 μm at most and even recently, only a dot mark having a size of 15 μm can generally be marked. Therefore, although according to the conventional general laser marking method, a dot mark having a required amount of information cannot be inscribed in the above-described very small region, as has been already described, the dot marks can be inscribed in the region according to the laser marking method by the inventors. Further, when a very small dot marks can be inscribed in the region by other marking method, the invention can be embodied naturally also by the method.

As a result of the above-described investigation, according to a first aspect of the invention, there is provided a semiconductor wafer, wherein the semiconductor wafer is formed with very small dot marks on an inner wall face of a notch formed on an outer peripheral face thereof by irradiating a laser beam having a diameter of 1 to 13 μm.

Further, as a region for inscribing dot marks, as has already been described, the linear portion of the notch is most pertinent, however, the linear portion is also a region interfering with the pin. Accordingly, a portion of the inner wall face of the notch which does not interfere with the pin at all is only a circular arc face (minimum radius: 0.9 mm) at a bottom portion thereof. When characters are intended to write on the circular arc face, marking of at least about one digit can be carried out in the transverse direction and accordingly, at this region, 2D codes are effectively utilized. For example, in marking by dots each having a diameter of 5 μm, 18×18 dots (corresponding to 25 characters in alphanumerical characters) constitute 90 μm in the transverse direction and a variation in an inscribing depth caused by irradiating the circular arc face with laser beam from one direction is 3 μm at maximum and also in this case the condition can sufficiently be covered by the above-described marking method previously proposed by the inventors.

According to a second aspect of the invention, there is provided the semiconductor wafer according to the first aspect wherein upper and lower edge line portions of the inner wall face of the notch are respectively chamfered to thereby constitute inclined faces and the dot marks are formed on the inclined faces. As has already been described, this is for avoiding interference with the pin. In the case of the invention, it is sufficient that a dimension in the height direction of the inclined face is 150 μm. When a dot mark of 5 μm is inscribed in a rectangular region comprising a length in the horizontal direction of 180 μm and a length in the vertical direction (height direction) of 60 μm, a total of a number of 12×36 dots can be inscribed and when 2D codes of data matrix is utilized, information of 31 characters enough for identifying a wafer can sufficiently be inscribed.

According to a third aspect of the invention, there is provided the semiconductor wafer according to the second aspect wherein an angle of inclination of the inclined face relative to a surface of the semiconductor wafer is equal to or smaller than 30 degree. This is prescribed to prevent chipping or cracking of the wafer or to restrain film formation residue to a minimum. Further, in the case of the inclined face at the inner wall portion of the notch as in the invention, when the angle of inclination is made larger than 30 degree, an interference is caused with a fabrication lens for marking which is arranged at a final stage and accordingly, the third aspect is provided to avoid the interference.

According to a fourth aspect of the invention, there is provided the semiconductor wafer according to the second aspect wherein a surface roughness Ra of the inclined face is equal to or smaller than 1 μm. The surface roughness R is represented by a value in μm calculated by the following equation when a portion having a measurement length of L is sampled from a roughness curve in a direction of its center line and the center line of the sampled portion is set to X-axis, a direction of vertical magnification is set to Y-axis and the roughness curve is represented by Y=f(X).

That is, the following equation is established.

$$R = \{\text{integration of } f(X) \text{ in } X=0 \text{ to } L\} \div L$$

In recent years, there is a tendency in which a shape of a side face at a peripheral edge portion of a wafer is formed in a circular arc shape with an object of preventing chipping or cracking of the wafer. The same goes with an inner wall face of a notch which is a region constituting an object of laser marking according to the invention. When dot marks having a very small mode, as mentioned above, is formed in a range of a length of 50 μm on a portion having a section in such a circular arc shape as shown by FIG. 3A, a depth of the mark varies owing to the curved face. Since a thickness of a current wafer falls in a range of 600 through 800 μm, even in the case of the thickness of 600 μm, when the variation is 1 μm and the surface roughness R exceeds 1 μm, the dot mark cannot be discriminated from recesses and projections at the surrounding. Incidentally, the depth of a dot mark formed by the above-described laser marking method developed by the inventors falls in a range of 0.01 through 5 μm and accordingly, the dot mark can sufficiently be identified.

According to a fifth aspect of the invention, there is provided the semiconductor wafer according to the second aspect wherein the dot marks are formed at at least either of the upper and lower inclined faces.

In fabrication steps of a wafer, there is a step proximate to a final step in which a rear face of the wafer is significantly polished to thereby thin in a total of the wafer. An amount of polishing the rear face is about several hundreds μm and in contrast thereto, an amount of polishing a surface thereof is only several μm. Specifically, there is case in which a wafer having a thickness of 725 to 775 μm is fabricated to a thickness of 150 to 200 μm by polishing the rear face. Accordingly, in consideration of the fact that the rear face side is significantly polished, it is preferable to form dot marks on the surface side as much as possible.

Meanwhile, even on the surface side of the wafer, particularly in the case of a soft mark which is polished by the CMP processing and inscribed on the wafer surface, the inscription becomes blurred gradually by the polishing action and the dot mark cannot be read. Further, when a hard mark is formed on the rear face of the wafer, an influence is effected on the flatness of the surrounding of the mark and adverse influence is effected on the depth of focus in exposure or a location of gathering dust and dirt or a source of producing thereof seems to be constituted.

In view of these points, the invention is featured in forming dot marks on the inner wall face of the notch, as mentioned above. As described in the second aspect of the invention, the wafer is chamfered to constitute the inclined faces along the upper and lower edge line portions of the notch in order to avoid also interference with the pin and the dot marks are formed on the inclined faces. Even in the case, in consideration of the above-described reason, it is necessary to select whether the dot marks are to be formed on the inclined face of the notch on the surface side of the wafer or whether the dot marks are to be formed on the inclined face of the notch on the rear face side of the wafer, as necessary. Normally, as mentioned above, even in the case of the inclined face on the surface side, it seems that influence of polishing by the CMP processing is not considerably effected and therefore, it is sufficient to form the dot marks on the upper inclined face of the notch. However, in consideration of a rare case, it is preferable to form the same dot marks also on the lower inclined face of the notch. Naturally, according to the invention, the dot marks can also be formed only on the lower inclined face of the notch.

DETAILED DESCRIPTION OF THE PREFERRED EMBODIMENTS

A specific explanation will be given of preferable embodiments according to the invention in reference to attached drawings as follows.

Figure 1:
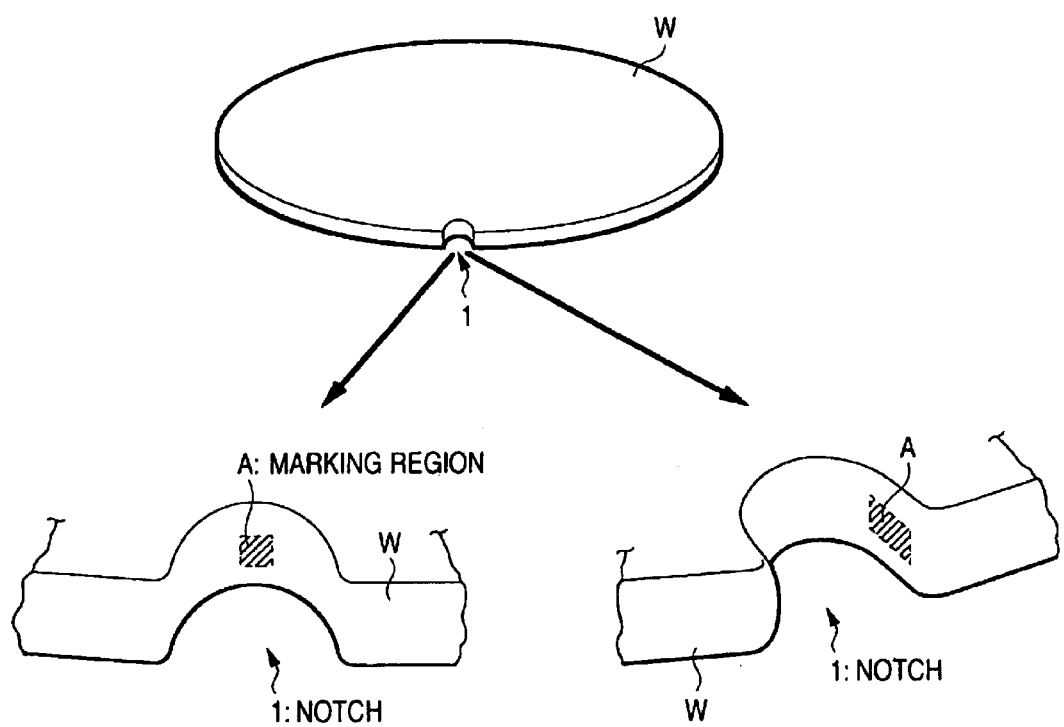
FIG. 1 is a explanatory view showing a semiconductor wafer according to the invention in which marking is carried out on a portion of a notch portion.
Figure 2:
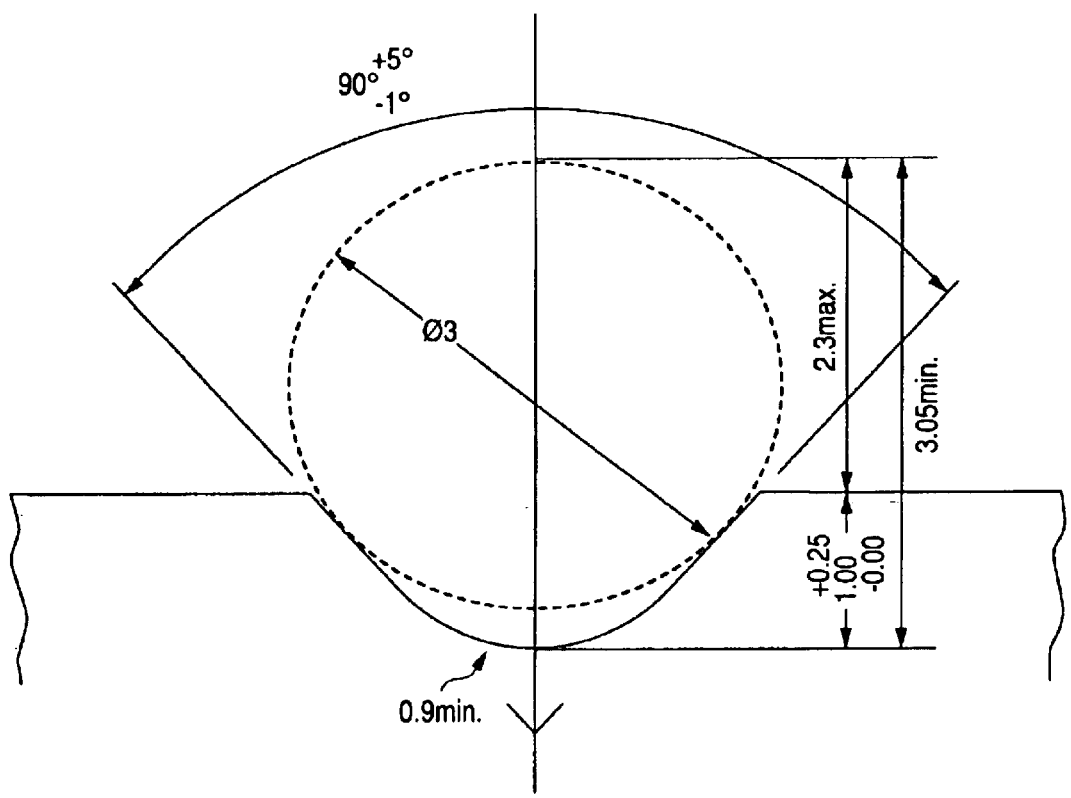
FIG. 2 is a plane view showing a relationship between a shape of a notch and a pin inserted into the notch.

FIG. 1 is an explanatory view schematically showing a dot mark region inscribed on an inner wall face of a notch according to a semiconductor wafer of the invention and FIG. 2 is a plane view showing a relationship between a shape of a notch prescribed in the SEMI standards and a pin inserted into the notch.

According to the invention, there is provided a semiconductor wafer for forming dot marks in a predetermined region A on an inner peripheral face of a notch of a semiconductor wafer, adverse influence particular to the dot marks formed by local irradiation of laser beam is not caused and the dot marks do not vanish by various processing steps from a stage of fabrication of the wafer to a dicing step in a device maker of a semiconductor and past fabrication history information is written by the dot marks.

It is preferable to form the dot marks at an stage as early as possible in the wafer fabrication and according to the embodiment, the dot marks are formed immediately after a step of a mirror finish chamfering step in respect of edge line portions of a notch which is the most preferable timing in wafer fabrication steps. The state of marking can be maintained at the chamfered portion after the step until a delivery stage and even a very small mark does not vanish. Further, according to the marking, at every step of wafer fabrication steps thereafter, fabrication conditions and inspection result can successively be marked and accordingly, not only an inspection result immediately before the marking step but also inspection results therebefore can be determined and classified.

It is preferable as the inspection result that a conductive type, resistivity, life time, oxygen and carbon concentrations and crystal defect are written by dot marks immediately before and immediately after a slicing step and appearance and optical observation result, a thickness and flatness are written similarly by dot marks after a mirror face fabrication step on a surface and a rear face of the wafer. However, in order to avoid influence of chemical polishing which is carried out after the slicing step, according to the embodiment, mirror finish chamfering is carried out along upper and lower edge line portions of the notch after the chemical polishing step and a first time of marking operation is carried out on the chamfered face of the notch immediately after the chamfering operation. Therefore, according to the embodiment, for example, a lot control is carried out for respective wafer cassettes during an interval of time from immediately before the slicing step to when the marking is carried out and inspection result of individual wafers is recorded.

Figure 3A:
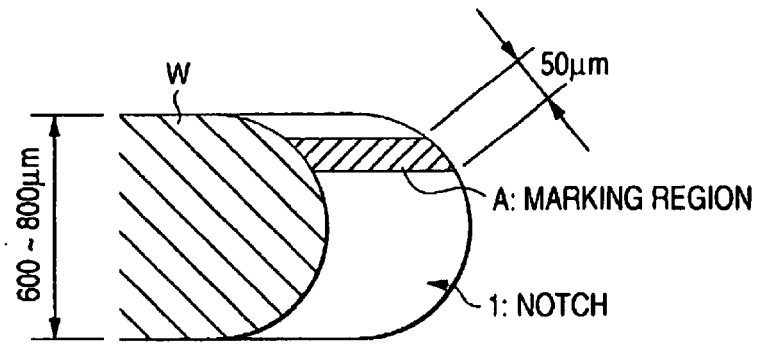
FIGS. 3A, 3B and 3C are sectional views showing examples of sectional shapes of a peripheral edge portion of a semiconductor wafer.
Figure 3B:
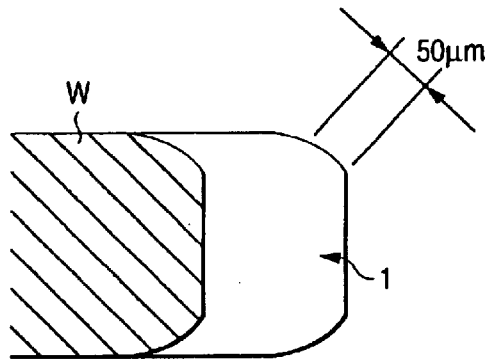
Figure 3C:
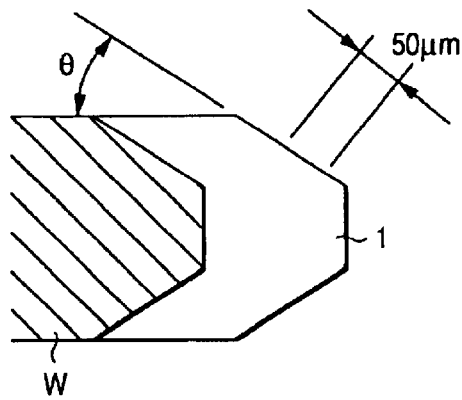

Although a shape of a side face at a peripheral edge portion of a wafer is standardized under alleviated prescription of SEMI, there is provided no prescription with regard to a shape and a surface roughness in respect of an inner portion of a notch. However, in order to mark dot marks on an inner wall face of a notch, the size of a dot mark and the shape of the inner wall face and the surface roughness suitable for the dot mark needs to previously be set. According to the embodiment, as the shape of the inner wall face of the notch 1, there are adopted shapes of a circular arc face bulged totally to the outer side as shown by FIG. 3A, inclined faces inclined down from upper and lower edge lines to the outer side while leaving a central portion as shown by FIG. 3B and a circular arc shape inclined down from the upper and the lower edge lines to the outer side while leaving a central portion. Further, the surface roughness R of the inclined face and the circular arc faces are respectively set to be equal to or smaller than 1 $\mu$m. In this case, the inclined face of the inner wall face of the notch according to the invention is generally referred to as the inclined-down face as well as the respective circular arc faces, mentioned above from a reason, mentioned below.

Figure 4:
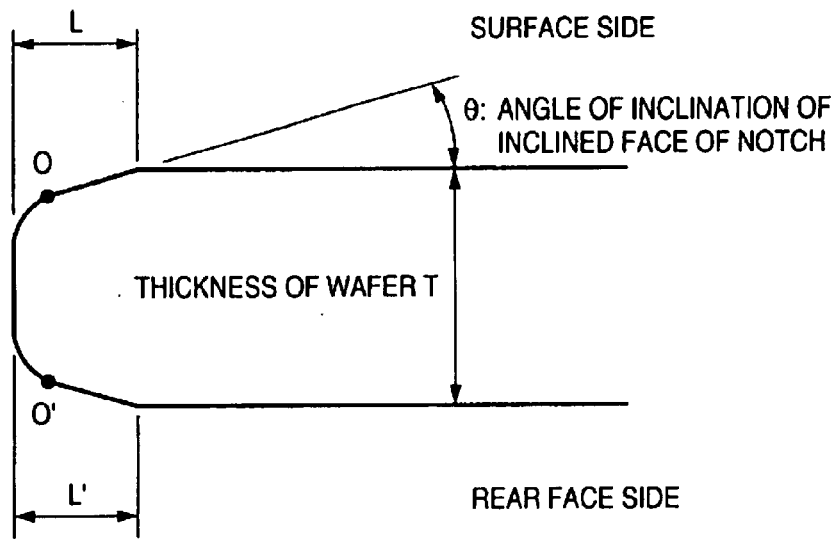
FIG. 4 is a sectional view showing a sectional shape of a peripheral edge portion of a notch according to an embodiment of the invention.

According to the embodiment, the shape of the peripheral edge portion of the inner wall face of the notch 1 is set as shown by FIG. 4. That is, there are formed inclined faces respectively inclined up toward a surface and a rear face of a wafer W having a thickness T of 0.725 mm from a vertical face of a front face of the notch 1 via chamfered portions (whose radius is 3 mm). In this case, an angle of inclination $\theta$ of the inclined face on the wafer surface side is set to 22 degree respectively to the surface and the rear face of the wafer W. The angle of inclination $\theta$ needs to be smaller than 30 degree. This is because in marking the inner wall face of the notch 1, when the angle of inclination $\theta$ is larger than 30 degree, the wafer W interferes with a final fabrication lens. Further, a horizontal dimension L between the front face of the notch 1 and a terminal end of the inclined face on the wafer surface side is set to 0.15 to 0.45 mm and a horizontal dimension L' between the front face of the notch 1 to a terminal end of the inclined face on the rear face side is set to 0.20 to 0.50 mm. These horizontal dimensions L and L' are determined by changing distances between start points O and O' of the inclined faces and the surface and the rear face of the wafer.

A plane shape of the notch 1 is as shown by FIG. 2. In plane view, a longest dimension from a side face of the wafer W to a bottom portion of the notch 1 falls in a range of 1 to 1.25 mm, the bottom portion defines a circular arc face, radius of curvature thereof is determined to be equal to or larger than 0.9 mm and an angle of an opening extended linearly from the bottom portion and opened at the side face of the wafer is 90 degree. Further, also an end edge of the opening is chamfered by 0.9 mm and accordingly, a linear portion except the circular arc face portion of the bottom portion of the notch 1 becomes 0.669 mm at maximum.

In this way, the dimension of the notch 1 is extremely small and in the case of providing a marking on the inner wall face of the notch 1, dimensions of the mark are restricted self-evidently. A portion of the inner wall face of the dot 1 which is most suitable for writing is the linear portion and a length of the linear portion is about 1 mm at maximum. When the linear portion is written with alpha-numerical characters by single font 5×9 dots according to the SEMI standards, as a minimum number of characters, 12 characters are needed to cover a minimum amount of information. At this occasion, respective characters need to write at intervals of 1 dot.

Therefore, in order to write the characters at the linear portion of 1 mm, the size of 1 dot is as follows.

$$1000(\mu m) \div \{6(dot) \times 12(character)\} = 13.89(\mu m).$$

Accordingly, the size of 1 dot in the planar direction is 13.89 $\mu$m at maximum and the size needs to be smaller than that.

Figure 5:
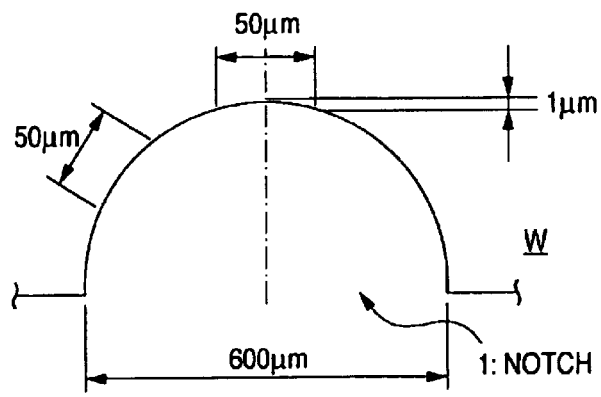
FIG. 5 is a plane view showing a difference in a dimension of a wall face in a marking region of an inner wall face of a notch.

Meanwhile, in the case of optically reading such a very small dot mark from an inscribed face, the surface of the inclined face needs to be smoothed more than that. Further, recently, the sectional shape of the peripheral edge portion is frequently formed in the circular arc shape as shown by FIG. 3A in order to prevent chipping or cracking of the peripheral edge portion of the wafer W. In this case, since the thickness of the wafer W generally falls in a range of 600 to 800 $\mu$m, when a character having a character height of 50 $\mu$m is intended to mark on the side face, as shown by FIG. 5, a difference in height between an uppermost portion and a lowermost portion of a character in a circular shape having a diameter of 600 $\mu$m is about 1 $\mu$m. By taking these situations into consideration, the surface roughness R of the inclined face (including circular arc face) needs to be equal to or smaller than 1 $\mu$m. As a result, a beautiful mark can be inscribed on a substantially plane portion.

The marking according to the invention is formed on both or either of an inclined face formed on an upper half of the notch 1 and an inclined face formed on a lower half thereof.

In fabricating the wafer W, there is a step of thinning a total of the wafer by significantly polishing a total of the rear face of the wafer W proximately to a final step. Accordingly, there poses a problem in which a total of marks on the rear face vanish. Further, there also poses a problem in which markings on the surface of the wafer are polished by the CMP (chemical and mechanical polishing) step, are gradually shallowed and finally become blurred and cannot be read. However, the principal polishing operation in the CMP step is mechanical polishing by very small abrasive grains included in a slurry, there is also no direct mechanical polishing operation in the case of markings on an inclined face as in the invention and accordingly, markings on the inclined face is preferable also from this view point. Incidentally, an amount of polishing the rear face is about several hundreds $\mu$m and an amount of polishing the surface is several $\mu$m. Therefore, also according to the invention, it is preferable to carry out marking on a region as proximate to the surface as possible in the inclined face formed at the upper half of the notch 1 also in view of avoiding interference with the pin.

Meanwhile, there also is an advantage in inscribing markings on the inclined face formed at the lower half of the notch 1. Considering the fact that there poses the problem in which a mark inscribed on the surface of the wafer is polished in the CMP (mechanical and chemical polishing) step, becomes gradually shallow, and finally becomes blurred and cannot be read, as described above, despite the inclined face of the upper half, in order to firmly avoid the influence in the CMP step, it is effective to inscribe markings on the inclined face formed at the lower half of the wafer W where a polishing solution does not round about. However, considering the fact that the rear face of the wafer W is significantly polished as mentioned above, in view of being polished in later steps, the lower half of the inclined face formed at the inner wall face of the notch 1 may be formed by the angle of inclination θ by previously deviating the inclined face to the surface side of the wafer W.

In inscribing dot marks on the inclined face of the notch 1 having the above-described dimensional mode, as has been described already, a maximum planar dimension needs to be 13.89 $\mu$m, preferably, 13 $\mu$m or smaller. Such a very small dot mark can be inscribed by the laser marking method disclosed in Japanese Patent Application No. 323080/1997 and Japanese Patent Application No. 323081/1997 previously developed by the inventors. Further, according to the embodiment, as laser fabrication conditions, laser beam is second harmonic of YAG laser and a fabrication optical system is provided with a specification as disclosed in the applications. Therefore, specific conditions are disclosed in the applications and accordingly, a detailed explanation thereof will be omitted here and only an outline of laser fabrication will be explained.

Figure 6:
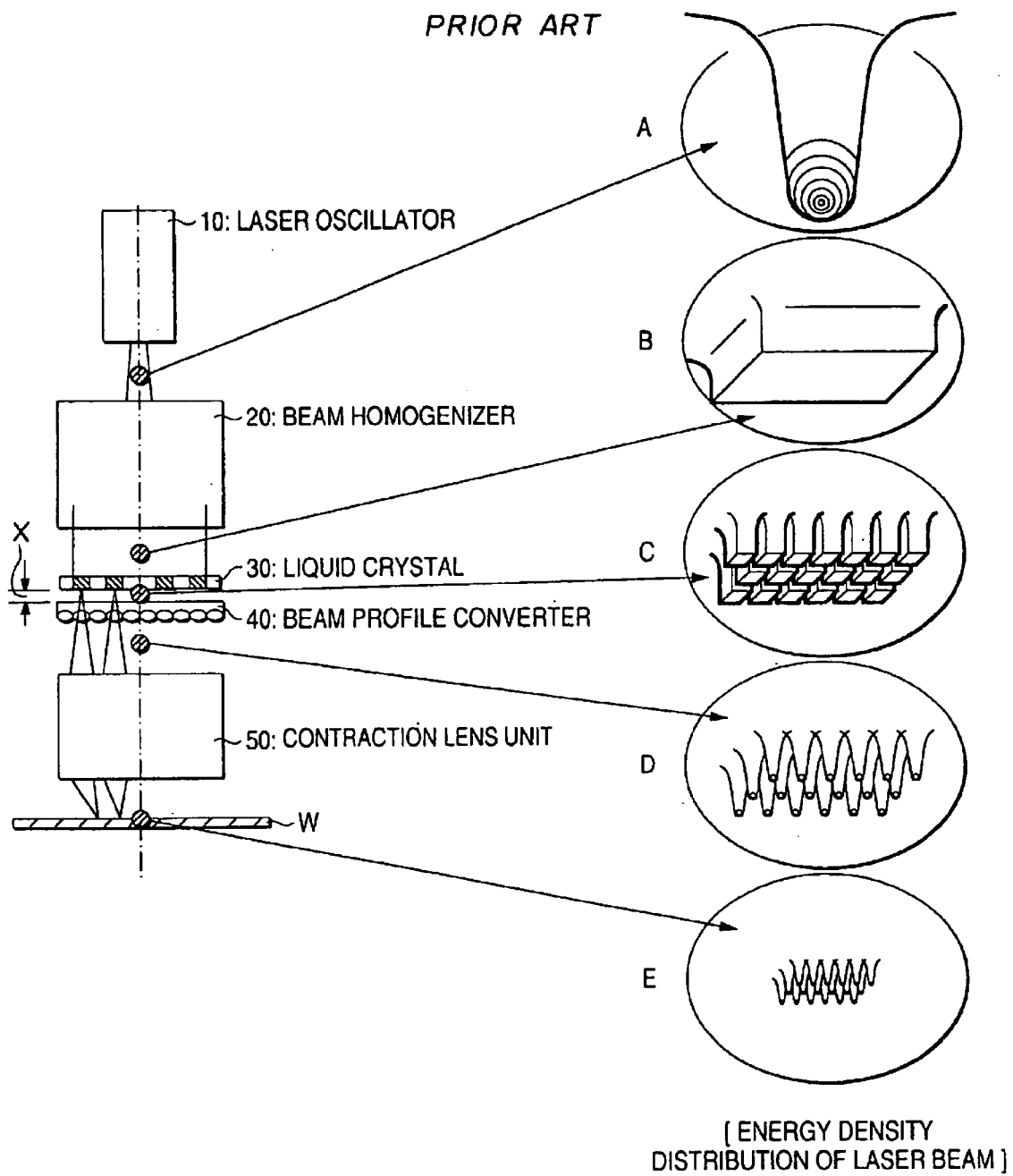
FIG. 6 is an explanatory view schematically showing a very small dot marking apparatus applied to the invention and a procedure of converting an energy density distribution (beam profile) of laser beam.

In FIG. 6, numeral 10 designates a laser oscillator, numeral 20 designates a beam homogenizer, numeral 30 designates a liquid crystal mask, numeral 40 designates a beam profile converter, numeral 50 designates a focusing lens unit and notation W designates a semiconductor wafer. In this case, a semiconductor wafer is referred not only as a silicon wafer but also generally as a semiconductor wafer on the surface of which an oxide film or a nitride film is formed and further epitaxially grown or a semiconductor wafer formed by gallium arsenide or indium phosphor compound.

According to the embodiment, laser beam having an energy density distribution in a Gaussian shape emitted from the laser oscillator 10, is firstly made to transmit through the beam homogenizer and is formed into an energy density distribution shape (B) of a top hat type where a peak value is substantially uniform.

Figure 7:
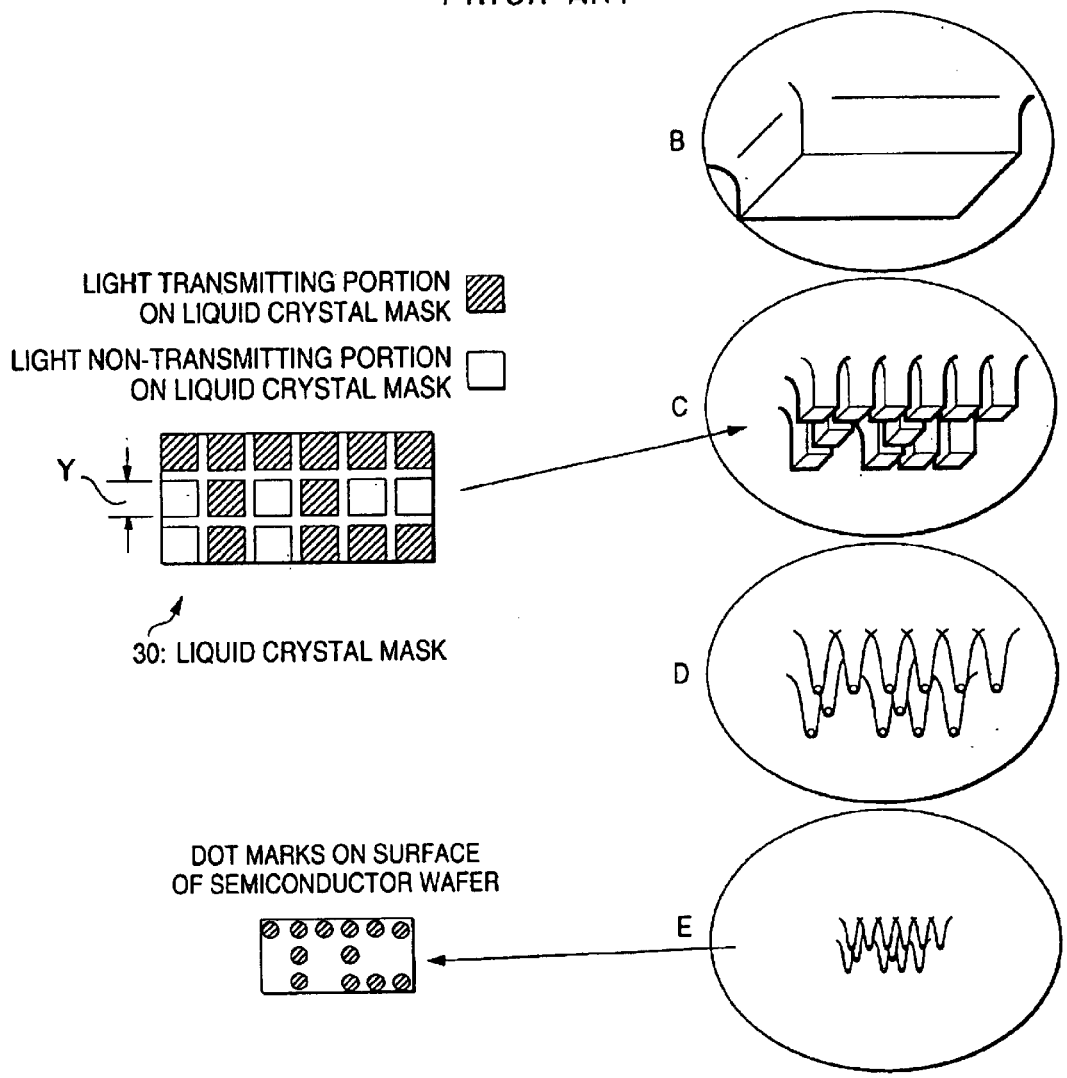
FIG. 7 is an explanatory view schematically showing dot marks formed in accordance with a display pattern of a liquid crystal mask in the marking apparatus and a procedure of converting an energy distribution of laser beam.

Laser beam uniformly formed with the energy density distribution in this way, is successively irradiated on the surface of the liquid crystal mask 30. At this occasion, as is widely known, the liquid crystal mask 30 can drive to display a required marking pattern on the mask. As shown by FIG. 7, the laser beam transmits dot portions in a region displaying the pattern which are brought into a light transmittable state. An energy density distribution of respective fluxes of transmitted light formed by dividing the laser beam in accordance with the respective dots and transmitting the laser beam therethrough, is also the same as the shape (B) formed by the beam homogenizer 20 and the fluxes are uniformly distributed.

According to the embodiment, a number of regions in the liquid crystal mask 30 which are irradiated in one operation, falls in a range of 5×10 to 10×10 in a number of dots and these are summarizingly irradiated. Such a number of dots cannot frequently satisfy a necessary number of all of dot marks and accordingly, the mark pattern is divided into several partitions and the partitions are successively displayed on the liquid crystal mask and the partitions are combined while switching them to thereby form a total of the mark pattern on the surface of the wafer. In this case, when the mark pattern is focused on the surface of the wafer, the wafer or an irradiated position thereof naturally needs to control to move. As such a control method, there can be adopted various methods which have publicly known conventionally.

According to the embodiment, fluxes of the laser beam in a unit of dot which have transmitted to the liquid crystal mask 30 are successively irradiated on the beam profile converter 40. In correspondence with individual liquid crystal cells arranged in a matrix shape of the liquid crystal mask 30, portions of the beam profile converter 40 are arranged similarly in a matrix shape. Therefore, the fluxes of the laser beam which have transmitted through the liquid crystal mask 30, transmit through the beam profile converter 40 at respective dots in a one-to-one correspondence and the fluxes of the laser beam having the energy density distribution respectively smoothed by the beam homogenizer 20, are converted into fluxes of laser beam having an energy density distribution necessary for forming the very small dots.

The fluxes of the laser beam which have transmitted through the beam profile converter 40 are condensed by the lens unit 50 and are irradiated onto predetermined positions on the surface of the semiconductor wafer W to thereby constitute necessary dot marking on the surface. In this case, when markings with a unit of micrometer are intended to form uniformly on a plurality of wafer surfaces, distances between the marking faces and the condensing lens and alignment of optical axes need to adjust by the unit of micrometer. According to the embodiment, in detecting a focal point, a height measurement is carried out by a common focal point system which is generally used in a laser microscope and the focal point is automatically positioned by feeding back a value of the measurement to a very small positioning mechanism in the vertical direction of the lens. Further, in alignment of focal axes and positioning and adjustment of optical constituent parts, there is adopted a method which is generally known and the adjustment is carried out by a screw adjusting mechanism to adapt to a previously set reference spot via guide beam of, for example, He—Ne laser. The adjustment may be carried out once in integrating operations.

The above-described beam homogenizer 20 is generally referred as an optical part for forming laser beam having an energy density distribution in, for example, a Gaussian shape into laser beam having a shape of a smoothed energy density distribution. In respect of the optical part, there is provided a system of summarizingly irradiating the mask face by using a fly eye lens, binary optics or cylindrical lens or scanning the mask face by mirror driving of a polygonal mirror or an actuator of a mirror scanner.

The above-described beam profile converter 40 is an optical part for converting the energy density distribution smoothed by the beam homogenizer 20 into a shape of an optimum energy density distribution to provide a dot shape particular to the invention and the beam profile converter 40 converts a profile of an energy density distribution of incident laser beam to an arbitrary shape by a diffraction phenomenon, a refraction phenomenon or by arbitrarily varying the optical transmittance at a laser-irradiated point.

According to the invention, a maximum length of a very small dot mark falls in a dimension range of 1 to 13 $\mu$m and a height between a recess and a projection of a dot falls in a range of 0.01 to 5 $\mu$m. It is necessary for forming a dot mark having such dimensions that a length of a side per dot of the above-described liquid crystal mask falls in a range of 50 to 2000 $\mu$m in order to prevent a focus image at an irradiated point on the surface of the semiconductor wafer W from being deteriorated owing to the resolution of the contraction lens unit. Further, when an interval of arranging the beam profile converting means and the liquid crystal mask is excessively large or excessively small, a disturbance is liable to cause in a focused image on the surface of the semiconductor wafer by undergoing an influence of surrounding light ray or undergoing an influence of instability of optical axes. Hence, according to the embodiment, an interval X of arranging the beam profile converting means 40 and the liquid crystal mask 30 is set to 0 through 10 times as much as a maximum length Y of 1 dot of the liquid crystal mask 30. By prescribing the arrangement interval in such a range, the focused image irradiated on the surface of the wafer becomes clear and sharp.

Figure 8:
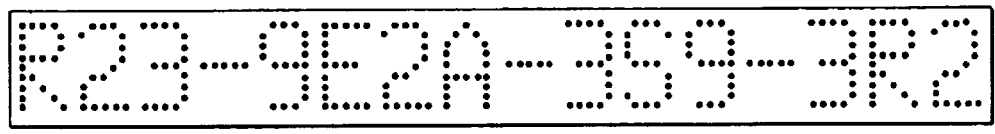
FIG. 8 is a plane view showing alphanumerical characters by dot marks inscribed on an inclined face of a notch of a semiconductor wafer.

FIG. 8 shows alphanumerical characters constituted by actual dot marks inscribed on the above-described inclined face formed on the inner wall face of the notch of the wafer W.

Marking conditions according to the embodiment are as follows.

Used font: 5×9 single dot font, alphanumerical characters of 18 characters

Dot size: 1 dot, 5 $\mu$m

Marking region:

$$540(\mu m)=5(\mu m/dot) \times 6(dot/character) \times 18(character)$$

Therefore, according to the embodiment, the marking region in the horizontal direction becomes to be as long as 540 $\mu$m, which falls within a dimension 669 $\mu$m of the linear portion of the notch 1, already described.

As is apparent from the above-described explanation, according to the invention, all of history information in semiconductor wafer fabrication steps can be written on a wafer. Particularly, by marking a final inspection result immediately before delivery of the wafer, the wafer state at the time point of delivery can be grasped at once even after delivering the wafer to a device maker. Further, according to the semiconductor wafer of the invention, a laser mark can be inscribed on an inclined face of a notch or the mark can be read in a state in which the wafer is contained in the cassette and accordingly, conventional control of a unit of cassette or respective lot is not needed. Particularly, the marking region is an extremely small region of an inner wall face of a portion of a notch and accordingly, in reading the mark, complicated operation is not particularly needed.

What is claimed is:

1. A semiconductor wafer having an outer peripheral face containing a notch having an inner wall face extending inwardly and away from the outer peripheral face of the semiconductor wafer towards a center of the semiconductor wafer, wherein markings made from dot marks respectively having a maximum length of 1 to 13 μm are formed on the inner wall face.

2. The semiconductor wafer according to claim 1, wherein upper and lower edge line portions of the inner wall face of the notch are respectively chamfered to thereby constitute upper and lower inclined faces and the dot marks are formed on the inclined faces.

3. The semiconductor wafer according to claim 2, wherein an angle of an inclination of at least one inclined face relative to the surface of the semiconductor wafer is equal to or smaller than 30 degrees.

4. The semiconductor wafer according to claim 2, wherein a surface roughness of at least one inclined face is equal to or smaller than 1 μm.

5. The semiconductor wafer according to claim 2, wherein the dot marks are formed on either one of the upper and lower inclined faces.

6. The semiconductor wafer according to claim 5, wherein an angle of an inclination of the inclined face relative to the surface of the semiconductor wafer is equal to or smaller than 30 degrees.

7. The semiconductor wafer according to claim 5, wherein a surface roughness of the inclined face is equal to or smaller than 1 μm.

8. The semiconductor wafer according to claim 1, wherein the dot marks are formed by irradiating a laser beam.

9. The semiconductor wafer according to claim 1, wherein the dot mark has a height in the range of 0.005 to 5 μm.

10. The semiconductor wafer according to claim 1, wherein the markings include alphanumeric characters.

11. The semiconductor wafer according to claim 10, wherein a single font of the alphanumeric characters are arranged in a pattern of 5 dot marks by 9 dot marks.

12. The semiconductor wafer according to claim 1, wherein the markings are arranged on the inner surface of the notch prior to fabrication steps of a slicing step, and before mirror face fabrication step and chemical polishing step.

13. The semiconductor wafer according to claim 1, wherein the markings contain all the history information concerning fabrication steps for fabricating the semiconductor wafer.

14. The semiconductor wafer according to claim 1, wherein the notch has a shape so that a secluded portion of the inner wall face will not contact a member inserted into the notch for orienting the semiconductor wafer, and the markings are formed on the secluded portion of the inner wall face.

15. A semiconductor wafer comprising a marked semiconductor wafer made from a semiconductor wafer that was subjected to at least one fabrication step that is visibly discernible on the marked semiconductor wafer;

the marked semiconductor wafer having an outer peripheral face containing a notch, the notch extending inwardly and away from the outer peripheral face of the semiconductor and towards a center of the semiconductor, the notch having an inner wall face separated from and arranged inside the outer peripheral face of the marked semiconductor; the inner wall face of the notch containing markings, and the markings being dot marks having a maximum length of 1 to 13 μm.

16. The semiconductor wafer according to claim 15, wherein the notch has a shape so that a secluded portion of the inner wall face will not contact a member inserted into the notch for orienting the semiconductor wafer, and the markings are formed on the secluded portion of the inner wall face.

17. A semiconductor wafer having a peripheral surface that was treated with processing steps, so that the peripheral surface contains visibly discernible structure resulting from the processing steps; and the inner surface of the semiconductor wafer including a notch, the notch extending inwardly and away from the peripheral surface of the semiconductor and towards a center of the semiconductor, the notch having an inner wall face separated from and arranged inside the peripheral surface of the semiconductor; the inner wall face of the notch containing markings, and the markings being dot marks having a maximum length of 1 to 13 μm.

18. The semiconductor wafer according to claim 17, wherein the notch has a shape so that a secluded portion of the inner wall face will not contact a member inserted into the notch for orienting the semiconductor wafer, and the markings are formed on the secluded portion of the inner wall face.

* * * * *